(12) United States Patent
Sipani et al.

(10) Patent No.: US 8,846,517 B2
(45) Date of Patent: *Sep. 30, 2014

(54) METHODS OF FORMING A PATTERN ON A SUBSTRATE

(71) Applicant: Micron Technology, Inc., Boise, ID (US)

(72) Inventors: Vishal Sipani, Boise, ID (US); Anton J. deVilliers, Clifton Park, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/133,962

(22) Filed: Dec. 19, 2013

(65) Prior Publication Data

US 2014/0127909 A1    May 8, 2014

Related U.S. Application Data

(63) Continuation-in-part of application No. 13/542,913, filed on Jul. 6, 2012, now Pat. No. 8,629,048.

(51) Int. Cl.
  *H01L 21/3205* (2006.01)
  *H01L 21/311* (2006.01)
  *H01L 21/033* (2006.01)

(52) U.S. Cl.
  CPC ...... *H01L 21/31144* (2013.01); *H01L 21/0337* (2013.01); *H01L 21/0338* (2013.01)
  USPC ............ 438/595; 438/587; 438/622; 438/761

(58) Field of Classification Search
  USPC ......... 438/595, 587, 588, 618, 622, 767, 778, 438/761
  See application file for complete search history.

(56) References Cited

U.S. PATENT DOCUMENTS

| 4,910,168 A | 3/1990 | Tsai |
| 5,008,207 A | 4/1991 | Blouse et al. |
| 5,013,680 A | 5/1991 | Lowrey et al. |
| 5,047,117 A | 9/1991 | Roberts |

(Continued)

FOREIGN PATENT DOCUMENTS

| CN | 1550889 | 12/2004 |
| CN | 1752844 | 3/2006 |

(Continued)

OTHER PUBLICATIONS

U.S. Appl. No. 11/714,378, filed Mar. 5, 2007, Preliminary Amendment.

(Continued)

*Primary Examiner* — Kevin M Picardat
(74) *Attorney, Agent, or Firm* — Wells St. John, P.S.

(57) ABSTRACT

A method of forming a pattern on a substrate includes forming longitudinally elongated first lines and first sidewall spacers longitudinally along opposite sides of the first lines elevationally over an underlying substrate. Longitudinally elongated second lines and second sidewall spacers are formed longitudinally along opposite sides of the second lines. The second lines and the second sidewall spacers cross elevationally over the first lines and the first sidewall spacers. The second sidewall spacers are removed from crossing over the first lines. The first and second lines are removed in forming a pattern comprising portions of the first and second sidewall spacers over the underlying substrate. Other methods are disclosed.

19 Claims, 10 Drawing Sheets

(56) References Cited

U.S. PATENT DOCUMENTS

| | | |
|---|---|---|
| 5,254,218 A | 10/1993 | Roberts et al. |
| 5,328,810 A | 7/1994 | Lowrey et al. |
| 5,372,916 A | 12/1994 | Ogawa et al. |
| 5,382,315 A | 1/1995 | Kumar |
| 5,420,067 A | 5/1995 | Hsu |
| 5,429,988 A | 7/1995 | Huang et al. |
| 5,573,837 A | 11/1996 | Roberts et al. |
| 5,593,813 A | 1/1997 | Kim |
| 5,616,510 A | 4/1997 | Wong |
| 5,905,279 A | 5/1999 | Nitayama et al. |
| 5,916,821 A | 6/1999 | Kerber |
| 6,063,688 A | 5/2000 | Doyle et al. |
| 6,087,263 A | 7/2000 | Clampitt et al. |
| 6,140,217 A | 10/2000 | Jones et al. |
| 6,174,818 B1 | 1/2001 | Tao et al. |
| 6,207,490 B1 | 3/2001 | Lee |
| 6,235,574 B1 | 5/2001 | Tobben et al. |
| 6,249,335 B1 | 6/2001 | Hirukawa et al. |
| 6,303,272 B1 | 10/2001 | Furukawa et al. |
| 6,352,932 B1 | 3/2002 | Clampitt et al. |
| 6,383,952 B1 | 5/2002 | Subramanian et al. |
| 6,429,123 B1 | 8/2002 | Tseng |
| 6,483,136 B1 | 11/2002 | Yoshida et al. |
| 6,545,904 B2 | 4/2003 | Tran |
| 6,548,385 B1 | 4/2003 | Lai |
| 6,548,401 B1 | 4/2003 | Trivedi |
| 6,566,280 B1 | 5/2003 | Meagley et al. |
| 6,580,136 B2 | 6/2003 | Mandelman et al. |
| 6,599,844 B2 | 7/2003 | Koh et al. |
| 6,605,541 B1 | 8/2003 | Yu |
| 6,627,524 B2 | 9/2003 | Scott |
| 6,630,379 B2 | 10/2003 | Mandelman et al. |
| 6,638,441 B2 | 10/2003 | Chang et al. |
| 6,649,958 B2 | 11/2003 | Fujisawa |
| 6,667,502 B1 | 12/2003 | Agarwal et al. |
| 6,703,323 B2 | 3/2004 | Kong et al. |
| 6,710,390 B2 | 3/2004 | Parekh et al. |
| 6,734,107 B2 | 5/2004 | Lai et al. |
| 6,735,132 B2 | 5/2004 | Siek |
| 6,753,220 B2 | 6/2004 | Juengling |
| 6,756,619 B2 | 6/2004 | Tran |
| 6,774,051 B2 | 8/2004 | Chung et al. |
| 6,811,817 B2 | 11/2004 | Sugeta et al. |
| 6,826,069 B2 | 11/2004 | Kurjanowicz et al. |
| 6,864,184 B1 | 3/2005 | Gabriel |
| 6,872,512 B2 | 3/2005 | Yamashita |
| 6,893,972 B2 | 5/2005 | Rottstegge et al. |
| 6,905,975 B2 | 6/2005 | Boettiger et al. |
| 6,916,594 B2 | 7/2005 | Bok et al. |
| 6,951,822 B2 | 10/2005 | Scholz |
| 7,023,069 B2 | 4/2006 | Blanchard |
| 7,037,840 B2 | 5/2006 | Katz |
| 7,042,038 B2 | 5/2006 | Yoshida et al. |
| 7,049,652 B2 | 5/2006 | Mokhlesi et al. |
| 7,064,376 B2 | 6/2006 | Shau |
| 7,067,385 B2 | 6/2006 | Manning |
| 7,074,533 B2 | 7/2006 | Fuller et al. |
| 7,098,105 B2 | 8/2006 | Juengling |
| 7,115,525 B2 | 10/2006 | Abatchev et al. |
| 7,125,781 B2 | 10/2006 | Manning et al. |
| 7,151,040 B2 | 12/2006 | Tran et al. |
| 7,166,533 B2 | 1/2007 | Happ |
| 7,199,005 B2 | 4/2007 | Sandhu et al. |
| 7,202,127 B2 | 4/2007 | Musch et al. |
| 7,202,174 B1 | 4/2007 | Jung et al. |
| 7,230,292 B2 | 6/2007 | Graettinger |
| 7,253,118 B2 | 8/2007 | Tran et al. |
| 7,265,059 B2 | 9/2007 | Rao et al. |
| 7,271,108 B2 | 9/2007 | Sadjadi |
| 7,314,810 B2 | 1/2008 | Jung et al. |
| 7,320,911 B2 | 1/2008 | Basceri et al. |
| 7,339,252 B2 | 3/2008 | Blanchard |
| 7,361,609 B2 | 4/2008 | Hah et al. |
| 7,384,849 B2 | 6/2008 | Parekh et al. |
| 7,387,939 B2 | 6/2008 | Manning |
| 7,390,749 B2 | 6/2008 | Kim et al. |
| 7,390,750 B1 | 6/2008 | Ramkumar et al. |
| 7,396,781 B2 | 7/2008 | Wells |
| 7,439,152 B2 | 10/2008 | Manning |
| 7,442,976 B2 | 10/2008 | Juengling |
| 7,517,753 B2 | 4/2009 | Manning |
| 7,521,371 B2 | 4/2009 | DeBruler |
| 7,521,378 B2 | 4/2009 | Fucsko et al. |
| 7,524,607 B2 | 4/2009 | Ho et al. |
| 7,537,866 B2 | 5/2009 | King Liu |
| 7,544,563 B2 | 6/2009 | Manning |
| 7,553,760 B2 | 6/2009 | Yang et al. |
| 7,557,013 B2 | 7/2009 | Bhat et al. |
| 7,557,015 B2 | 7/2009 | Sandhu et al. |
| 7,582,412 B2 | 9/2009 | Cameron et al. |
| 7,682,924 B2 | 3/2010 | Bhat et al. |
| 7,687,387 B2 | 3/2010 | Inaba et al. |
| 7,696,076 B2 | 4/2010 | Jung et al. |
| 7,713,818 B2 | 5/2010 | Chan |
| 7,754,591 B2 | 7/2010 | Jung |
| 7,790,357 B2 | 9/2010 | Jung |
| 7,790,360 B2 | 9/2010 | Alapati et al. |
| 7,807,575 B2 | 10/2010 | Zhou |
| 1,842,601 A1 | 11/2010 | Lee et al. |
| 7,846,646 B2 | 12/2010 | Kamijima |
| 7,851,135 B2 | 12/2010 | Jung et al. |
| 7,855,038 B2 | 12/2010 | Hah et al. |
| 7,897,460 B2 | 3/2011 | Parekh et al. |
| 7,923,371 B2 | 4/2011 | Shinohe |
| 7,959,818 B2 | 6/2011 | Jung |
| 8,067,286 B2 | 11/2011 | Parekh et al. |
| 8,083,953 B2 | 12/2011 | Millward et al. |
| 8,083,958 B2 | 12/2011 | Li et al. |
| 8,148,052 B2 | 4/2012 | Vanleenhove et al. |
| 8,247,302 B2 | 8/2012 | Sills |
| 8,273,634 B2 | 9/2012 | Sills |
| 8,338,304 B2 | 12/2012 | Zhou |
| 8,440,576 B2 | 5/2013 | Hong |
| 8,629,048 B1 * | 1/2014 | Sipani et al. .................. 438/595 |
| 8,629,527 B2 | 1/2014 | Parekh et al. |
| 2002/0037617 A1 | 3/2002 | Kim et al. |
| 2002/0043690 A1 | 4/2002 | Doyle et al. |
| 2002/0094688 A1 | 7/2002 | Mitsuiki |
| 2002/0130348 A1 | 9/2002 | Tran |
| 2003/0001214 A1 | 1/2003 | Yoshida et al. |
| 2003/0006410 A1 | 1/2003 | Doyle |
| 2003/0008968 A1 | 1/2003 | Sugeta et al. |
| 2003/0091936 A1 | 5/2003 | Rottstegge et al. |
| 2003/0096903 A1 | 5/2003 | Sugeta et al. |
| 2004/0043546 A1 | 3/2004 | Makoto et al. |
| 2004/0198065 A1 | 10/2004 | Lee et al. |
| 2004/0253535 A1 | 12/2004 | Cameron et al. |
| 2005/0058950 A1 | 3/2005 | Sugeta et al. |
| 2005/0130068 A1 | 6/2005 | Kondoh et al. |
| 2005/0142497 A1 | 6/2005 | Ryou et al. |
| 2005/0164478 A1 | 7/2005 | Chan et al. |
| 2005/0173740 A1 | 8/2005 | Jin |
| 2005/0214683 A1 | 9/2005 | Nishimura et al. |
| 2005/0255696 A1 | 11/2005 | Makiyama et al. |
| 2005/0272220 A1 | 12/2005 | Waldfried et al. |
| 2006/0011947 A1 | 1/2006 | Juengling |
| 2006/0024621 A1 | 2/2006 | Nolscher et al. |
| 2006/0046200 A1 | 3/2006 | Abatchev et al. |
| 2006/0046422 A1 | 3/2006 | Tran et al. |
| 2006/0046484 A1 | 3/2006 | Abatchev et al. |
| 2006/0063384 A1 | 3/2006 | Hah et al. |
| 2006/0088788 A1 | 4/2006 | Kudo et al. |
| 2006/0099347 A1 | 5/2006 | Sugeta et al. |
| 2006/0115978 A1 | 6/2006 | Specht et al. |
| 2006/0118785 A1 | 6/2006 | Allen et al. |
| 2006/0154182 A1 | 7/2006 | Brodsky |
| 2006/0240361 A1 | 10/2006 | Lee et al. |
| 2006/0262511 A1 | 11/2006 | Abatchev et al. |
| 2006/0263699 A1 | 11/2006 | Abatchev et al. |
| 2006/0273456 A1 | 12/2006 | Sant et al. |
| 2006/0278911 A1 | 12/2006 | Eppich |
| 2006/0281266 A1 | 12/2006 | Wells |
| 2006/0286795 A1 | 12/2006 | Yosho |
| 2007/0003878 A1 | 1/2007 | Paxton et al. |

(56) References Cited

U.S. PATENT DOCUMENTS

| | | |
|---|---|---|
| 2007/0010058 A1 | 1/2007 | Juengling |
| 2007/0020565 A1 | 1/2007 | Koh et al. |
| 2007/0023805 A1 | 2/2007 | Wells et al. |
| 2007/0026684 A1 | 2/2007 | Parascandola et al. |
| 2007/0037066 A1 | 2/2007 | Hsiao |
| 2007/0045712 A1 | 3/2007 | Haller et al. |
| 2007/0048674 A1 | 3/2007 | Wells |
| 2007/0048930 A1 | 3/2007 | Figura et al. |
| 2007/0049003 A1 | 3/2007 | Smythe |
| 2007/0049011 A1 | 3/2007 | Tran |
| 2007/0049030 A1 | 3/2007 | Sandhu et al. |
| 2007/0049035 A1 | 3/2007 | Tran |
| 2007/0049040 A1 | 3/2007 | Bai et al. |
| 2007/0077524 A1 | 4/2007 | Koh et al. |
| 2007/0077743 A1 | 4/2007 | Rao et al. |
| 2007/0085152 A1 | 4/2007 | Butler et al. |
| 2007/0096182 A1 | 5/2007 | Schloesser et al. |
| 2007/0099431 A1 | 5/2007 | Li |
| 2007/0105357 A1 | 5/2007 | Nejad et al. |
| 2007/0123015 A1 | 5/2007 | Chinthakindi et al. |
| 2007/0145464 A1 | 6/2007 | Voshell et al. |
| 2007/0148984 A1 | 6/2007 | Abatchev et al. |
| 2007/0161251 A1 | 7/2007 | Tran et al. |
| 2007/0181929 A1 | 8/2007 | Juengling |
| 2007/0190463 A1 | 8/2007 | Sandhu et al. |
| 2007/0197014 A1 | 8/2007 | Jeon et al. |
| 2007/0202671 A1 | 8/2007 | Jung |
| 2007/0202697 A1 | 8/2007 | Jung |
| 2007/0205438 A1 | 9/2007 | Juengling |
| 2007/0205443 A1 | 9/2007 | Juengling |
| 2007/0224537 A1 | 9/2007 | Nozaki et al. |
| 2007/0238053 A1 | 10/2007 | Hashimoto |
| 2007/0238299 A1 | 10/2007 | Niroomand et al. |
| 2007/0248916 A1 | 10/2007 | Kamijima |
| 2007/0261016 A1 | 11/2007 | Sandhu et al. |
| 2007/0264828 A1 | 11/2007 | Jung et al. |
| 2007/0264830 A1 | 11/2007 | Huang et al. |
| 2007/0278183 A1 | 12/2007 | Lee et al. |
| 2007/0281219 A1 | 12/2007 | Sandhu |
| 2007/0281488 A1 | 12/2007 | Wells et al. |
| 2007/0281493 A1 | 12/2007 | Fucsko et al. |
| 2008/0002475 A1 | 1/2008 | Yang et al. |
| 2008/0008969 A1 | 1/2008 | Zhou et al. |
| 2008/0026327 A1 | 1/2008 | Koo |
| 2008/0032243 A1 | 2/2008 | Jung |
| 2008/0032508 A1 | 2/2008 | Chang |
| 2008/0044770 A1 | 2/2008 | Nozaki et al. |
| 2008/0057692 A1 | 3/2008 | Wells et al. |
| 2008/0063986 A1 | 3/2008 | Jung |
| 2008/0064213 A1 | 3/2008 | Jung |
| 2008/0070165 A1 | 3/2008 | Fischer et al. |
| 2008/0076070 A1 | 3/2008 | Koh et al. |
| 2008/0085612 A1 | 4/2008 | Smythe et al. |
| 2008/0090416 A1 | 4/2008 | Rahu et al. |
| 2008/0113483 A1 | 5/2008 | Wells |
| 2008/0113511 A1 | 5/2008 | Park et al. |
| 2008/0122125 A1 | 5/2008 | Zhou |
| 2008/0171438 A1 | 7/2008 | Sinha et al. |
| 2008/0171446 A1 | 7/2008 | Kim et al. |
| 2008/0176152 A1 | 7/2008 | Hah et al. |
| 2008/0176406 A1 | 7/2008 | Ikeda et al. |
| 2008/0193658 A1 | 8/2008 | Millward |
| 2008/0199806 A1 | 8/2008 | Hatakeyama et al. |
| 2008/0199814 A1 | 8/2008 | Brzozowy et al. |
| 2008/0206950 A1 | 8/2008 | Bhat et al. |
| 2008/0210900 A1 | 9/2008 | Wojtczak et al. |
| 2008/0220600 A1 | 9/2008 | Alapati et al. |
| 2008/0254627 A1 | 10/2008 | Wells |
| 2008/0261349 A1 | 10/2008 | Abatchev et al. |
| 2008/0292991 A1 | 11/2008 | Wallow et al. |
| 2008/0296732 A1 | 12/2008 | Olson |
| 2008/0305636 A1 | 12/2008 | Kim et al. |
| 2009/0074958 A1 | 3/2009 | Xiao |
| 2009/0108415 A1 | 4/2009 | Lenski et al. |
| 2009/0117739 A1 | 5/2009 | Shin et al. |
| 2009/0130601 A1 | 5/2009 | Jeon |
| 2009/0130612 A1 | 5/2009 | Yang |
| 2009/0130852 A1 | 5/2009 | Kewley |
| 2009/0212016 A1 | 8/2009 | Cheng et al. |
| 2009/0214823 A1 | 8/2009 | Cheng et al. |
| 2009/0291397 A1 | 11/2009 | deVilliers |
| 2009/0298274 A1 | 12/2009 | Kajiwara |
| 2010/0009512 A1 | 1/2010 | Fishburn |
| 2010/0021573 A1 | 1/2010 | Gonzalez et al. |
| 2010/0028809 A1 | 2/2010 | Vanleenhove et al. |
| 2010/0040980 A1 | 2/2010 | Nishimura et al. |
| 2010/0068656 A1 | 3/2010 | Yeh et al. |
| 2010/0081265 A1 | 4/2010 | Mashita et al. |
| 2010/0093175 A1 | 4/2010 | Niroomand et al. |
| 2010/0129980 A1 | 5/2010 | Sandhu et al. |
| 2010/0130015 A1 | 5/2010 | Nakajima et al. |
| 2010/0130016 A1 | 5/2010 | deVilliers |
| 2010/0144150 A1 | 6/2010 | Sills et al. |
| 2010/0144151 A1 | 6/2010 | Sills et al. |
| 2010/0144153 A1 | 6/2010 | Sills et al. |
| 2010/0203740 A1 | 8/2010 | Li |
| 2011/0018055 A1 | 1/2011 | Ohta et al. |
| 2011/0127677 A1 | 6/2011 | Konishi |
| 2011/0147984 A1 | 6/2011 | Cheng et al. |
| 2013/0009283 A1 | 1/2013 | Zhou |
| 2013/0078574 A1 | 3/2013 | Peeters et al. |

FOREIGN PATENT DOCUMENTS

| | | |
|---|---|---|
| CN | 1761063 | 4/2006 |
| CN | 101026087 | 8/2007 |
| CN | 101145515 | 3/2008 |
| CN | 200980148546.9 | 11/2012 |
| CN | 200980148548.8 | 2/2013 |
| CN | 200980148590.X | 2/2013 |
| CN | 201080013110.1 | 5/2013 |
| EP | 0171111 | 2/1986 |
| EP | 1272974 | 10/2003 |
| EP | 09830819.0 | 3/2013 |
| EP | 10756541.8 | 5/2013 |
| EP | 09743197.7 | 6/2013 |
| EP | 09830818.2 | 7/2013 |
| EP | 098308120.8 | 8/2013 |
| JP | 56046531 | 4/1951 |
| JP | 58157135 | 9/1983 |
| JP | 59211231 | 11/1984 |
| JP | 64035916 | 7/1989 |
| JP | 1-292829 | 11/1989 |
| JP | 3270227 | 12/1991 |
| JP | 06-077180 | 3/1994 |
| JP | 6275577 A | 9/1994 |
| JP | 2002-217170 | 8/2002 |
| JP | 2003234279 | 8/2003 |
| JP | 2004134574 A | 4/2004 |
| JP | 2004247399 | 9/2004 |
| JP | 2005-243681 | 9/2005 |
| JP | 2006245625 | 9/2006 |
| JP | 2007017993 | 1/2007 |
| JP | 2007294511 | 11/2007 |
| JP | 2007305976 | 11/2007 |
| JP | 2008-072097 | 3/2008 |
| JP | 2008-072101 | 3/2008 |
| JP | 2009269974 | 12/2009 |
| KR | 20030056601 | 7/2003 |
| KR | 20030049198 | 8/2003 |
| KR | 20030089063 | 11/2003 |
| KR | 10-2004-0016678 | 2/2004 |
| KR | 4025289 | 3/2004 |
| KR | 20040057582 | 7/2004 |
| KR | 10-2007-0076793 | 7/2007 |
| KR | 10-2007-0122049 | 12/2007 |
| KR | 10-0784062 | 12/2007 |
| KR | 10-2008-0024053 | 3/2008 |
| KR | 10-2008-0039008 | 5/2008 |
| KR | 20080038983 A | 5/2008 |
| SG | 201300853-7 | 6/2013 |
| TW | 200702903 | 1/2007 |
| TW | 200818405 | 4/2008 |
| TW | 200834660 | 8/2008 |

(56) References Cited

FOREIGN PATENT DOCUMENTS

| | | |
|---|---|---|
| TW | 098113229 | 9/2012 |
| TW | 098139941 | 12/2012 |
| TW | 098139943 | 12/2012 |
| TW | 099140232 | 7/2013 |
| TW | 098139942 | 12/2013 |
| WO | WO 2006/104654 | 10/2006 |
| WO | WO2007/027558 | 3/2007 |
| WO | PCT/US2007/015729 | 1/2008 |
| WO | WO 2008/008338 | 1/2008 |
| WO | WO 2008/059440 | 5/2008 |
| WO | PCT/US2009/039793 | 10/2009 |
| WO | PCT/US2009/041500 | 12/2009 |
| WO | PCT/US2009/063978 | 5/2010 |
| WO | PCT/US2009/063999 | 5/2010 |
| WO | PCT/US2009/064004 | 5/2010 |
| WO | PCT/US2010/025495 | 9/2010 |
| WO | PCT/US2009/039793 | 11/2010 |
| WO | PCT/US2009/041500 | 12/2010 |
| WO | PCT/US2009/063978 | 6/2011 |
| WO | PCT/US2009/063999 | 6/2011 |
| WO | PCT/US2009/064004 | 6/2011 |
| WO | PCT/US2010/055488 | 6/2011 |
| WO | PCT/US2010/025495 | 9/2011 |

OTHER PUBLICATIONS

U.S. Appl. No. 13/101,485, filed May 5, 2011, Light et al.
Clariant, Polysilazane SODs Spinful 400 Series for STI/PMD Application; Oct. 19, 2009; 1 pp.
EE et al., "Innovative Solutions to Enhance the Legacy Equipments Towards One Generation Ahead in Flip Chip BGA 0.8mm Ball Pitch Technology", Sep. 2005; 4 pp.
Fritze et al., "Enhanced Resosulation for Future Fabrication", Jan. 2003, 5 pp.
Gallia et al., "A Flexible Gate Array Architecture for High-speed and High-Density Applications", Mar. 1996, pp. 430-436.
Hori et al., "Sub-40nm Half-Pitch Double Patterning with Resist Freezing Process", 2008 8 pp.
Lee et al., "Double-Patterning Technique Using Plasma Treatment of Photoresist",Sep. 20, 2007, 5 pp.
Liau et al., "Softbake and Post-exposure Bake Optimization for Process Window Improvement and Optical Proximity Effect Tuning", 2006, 7 pp.
Lu, "Advanced Cell Structuresw for Dynamic RAMs", Jan. 1989, pp. 27- 36.
Ma, "Plasma Resist Image Stabilization Technique (PRIST)", 1980, 2 pp.
Owa et al., "Immersion Lithography Ready for 45nm Manufacturing and Beyond", 2007, pp. 238-244.
Pease et al., "Lithography and Other Patterning Techniques for Future Electronics", Feb. 2008, pp. 248-270.
Tan et al., "Current Status of Nanonex Nanoimprint Solutions", 2004, 9 pp.
Terai et al., "Newly developed RELACS Process and materials for 64 nm node device and beyond"; Oct. 2005; pp. 20-21.

\* cited by examiner

METHODS OF FORMING A PATTERN ON A SUBSTRATE

RELATED PARENT DATA

This patent resulted from a continuation of U.S. patent application Ser. No. 13/542,913, filed Jul. 6, 2012, entitled "Methods of Forming a Pattern on a Substrate" naming Vishal Sipani and Anton J. deVilliers as inventors, the disclosure of which is incorporated by reference.

TECHNICAL FIELD

Embodiments disclosed herein pertain to methods of forming a pattern on a substrate, for example in the fabrication of integrated circuitry.

BACKGROUND

Integrated circuits are often formed on a semiconductor substrate such as a silicon wafer or other semiconductive material. In general, layers of various materials which are semiconductive, conductive, or electrically insulative are used to form the integrated circuits. By way of examples, the various materials may be doped, ion implanted, deposited, etched, grown, etc. using various processes. A continuing goal in semiconductor processing is to strive to reduce the size of individual electronic components, thereby enabling smaller and denser integrated circuitry.

One technique for patterning and processing semiconductor substrates is photolithography. Such may include deposition of a patternable masking layer commonly known as photoresist. Such materials can be processed to modify their solubility in certain solvents, and are thereby readily usable to form patterns on a substrate. For example, portions of a photoresist layer can be exposed to actinic energy through openings in a radiation-patterning tool, such as a mask or reticle, to change the solvent solubility of the exposed regions versus the unexposed regions compared to the solubility in the as-deposited state. Thereafter, the exposed or unexposed regions can be removed, depending on the type of photoresist, to leave a masking pattern of the photoresist on the substrate. Adjacent areas of the underlying substrate next to the masked portions can be processed, for example by etching or ion implanting, to effect the desired processing of the substrate adjacent the masking material. In certain instances, multiple different layers of photoresist and/or a combination of photoresists with non-radiation sensitive masking materials are used. Further, patterns may be formed on substrates without using photoresist.

The continual reduction in feature sizes places ever greater demands on the techniques used to form those features. For example, photolithography is commonly used to form patterned features such as conductive lines and arrays of contact openings to underlying circuitry. A concept commonly referred to as "pitch" can be used to describe the sizes of the repeating features in conjunction with spaces immediately adjacent thereto. Pitch may be defined as the distance between an identical point in two neighboring features of a repeating pattern in a straight-line cross section, thereby including the maximum width of the feature and the space to the next immediately adjacent feature. However, due to factors such as optics and light or radiation wavelength, photolithography techniques tend to have a minimum pitch below which a particular photolithographic technique cannot reliably form features. Thus, minimum pitch of a photolithographic technique is an obstacle to continued feature size reduction using photolithography.

Pitch doubling or pitch multiplication is one proposed method for extending the capabilities of photolithographic techniques beyond their minimum pitch. Such typically forms features narrower than minimum photolithography resolution by depositing one or more spacer-forming layers to have a total lateral thickness which is less than that of the minimum capable photolithographic feature size. The spacer-forming layers are commonly anisotropically etched to form sub-lithographic features, and then the features which were formed at the minimum photolithographic feature size are etched from the substrate.

Using such techniques where pitch is actually halved, the reduction in pitch is conventionally referred to as pitch "doubling". More generally, "pitch multiplication" encompasses increase in pitch of two or more times, and also of fractional values other than integers. Thus conventionally, "multiplication" of pitch by a certain factor actually involves reducing the pitch by that factor.

In addition to minimum feature size and placement of such features, it is often highly desirable that the features as-formed be uniform in dimension. Accordingly, uniformity when forming a plurality of features may also be of concern, and is increasingly a challenge as the minimum feature dimensions reduce.

DETAILED DESCRIPTION OF EXAMPLE EMBODIMENTS

Figure 1:
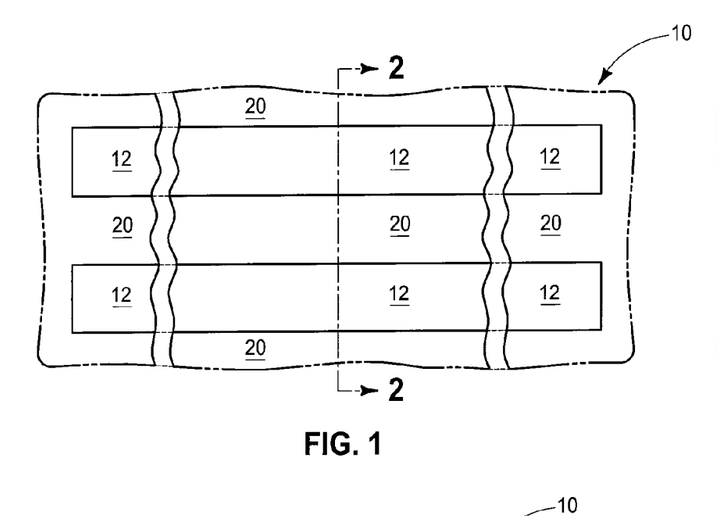
FIG. 1 is a diagrammatic top view of a substrate in process in accordance with an embodiment of the invention.
Figure 2:
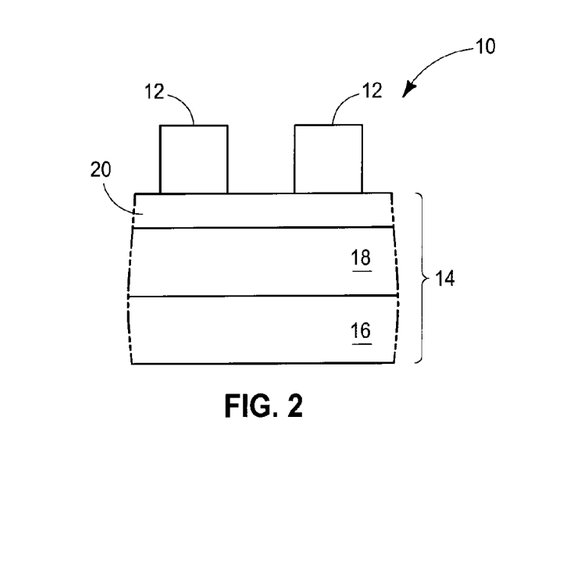
FIG. 2 is a cross-sectional view taken through line 2-2 in FIG. 1.
Figures 37, 38:
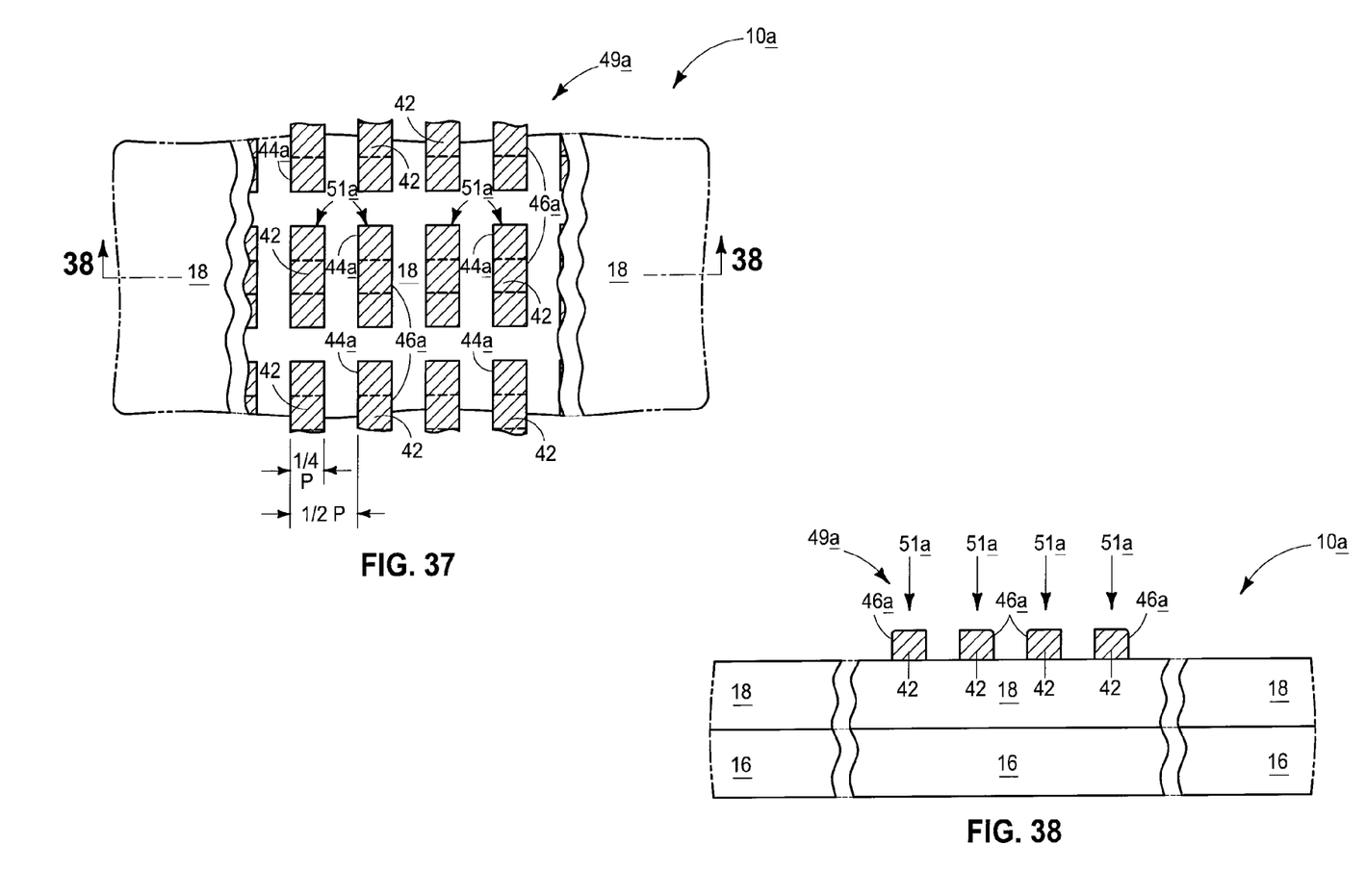
FIG. 37 is a view of a substrate showing alternate processing.
FIG. 38 is a cross-sectional view taken through line 38-38 in FIG. 37.

Example methods of forming a pattern on a substrate are initially described with reference to FIGS. 1-28 with respect to a substrate fragment 10 and with reference to FIGS. 37 and 38 with respect to a substrate fragment 10a. Referring to FIGS. 1 and 2 and substrate fragment 10, longitudinally elongated lines 12 have been formed over a substrate 14. The material of lines 12 and the material of substrate 14, and other materials referred to herein, may be homogenous or non-homogenous. As an example, substrate 14 may comprise bulk monocrystalline silicon and/or a semiconductor-on-insulator substrate. As an additional example, substrate 14 may comprise dielectric material having conductive contacts or vias therein which extend vertically or otherwise into electrical connection with electronic device components, regions, or material received elevationally inward of the dielectric material. Substrate 14 may be a semiconductor substrate. In the context of this document, the term "semiconductor substrate" or "semiconductive substrate" is defined to mean any construction comprising semiconductive material, including, but not limited to, bulk semiconductive materials such as a semi-conductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Only two lines 12 are shown for clarity in the figures, although likely thousands or millions of such lines may be fabricated over a substrate area of interest. Further, example lines 12 are shown as being of constant and equal width and height relative one another, as well as being equally spaced from one another by a distance equal to their width. Alternate shapes, sizes and/or configurations can be used.

Example substrate 14 is shown as comprising a base substrate 16 (e.g., semiconductor material) having material 18 and material 20 formed thereover. Material 20 may be used in forming a pattern over underlying substrate 16/18. Material 20 may comprise suitable masking material, for example hard-masking material, and one or more antireflective coating materials. An example material 20 is a Si—O—N-comprising material formed to an example thickness from about 50 Angstroms to about 500 Angstroms. An example material 18 is undoped polysilicon formed to an example thickness from about 50 Angstroms to 2,000 Angstroms. Regardless, any of materials 16, 18, and 20 may be conductive, dielectric, and/or semiconductive.

Figure 3:
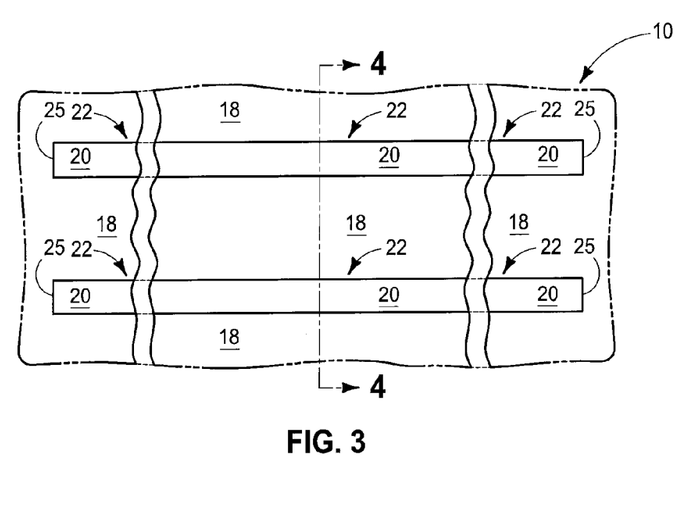
FIG. 3 is a view of the FIG. 1 substrate at a processing step subsequent to that shown by FIG. 1.
Figure 4:
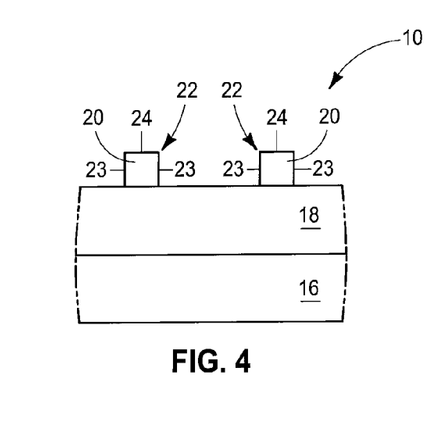
FIG. 4 is a cross-sectional view taken through line 4-4 in FIG. 3.

Referring to FIGS. 3 and 4, lines 12 (not shown) have been laterally trimmed to reduce their widths by half and then used as masking while etching material 20, thereby forming longitudinally elongated first lines 22 elevationally over an underlying substrate 16/18. Lines 12 (not shown) have been removed thereafter and/or during such etching. Greater, lesser, or no lateral trimming might be conducted of lines 12 (FIGS. 1 and 2) in producing first lines 22 of FIGS. 3 and 4. Further, alternate or yet-to-be developed techniques may be used in producing first lines 22. First lines 22 may be considered as respectively having opposite sides 23, tops 24 (i.e, elevationally outermost surfaces), and ends 25. Such are shown as being planar, with sides 23 being parallel one another and tops 24 of different lines being co-planar. Other constructions may be used. Further, first lines 22 may be straight linear or non-linear (e.g. have multiple angled segments, curved segments, and/or be curvilinear, etc.), and may run parallel or non-parallel relative one another.

Figure 5:
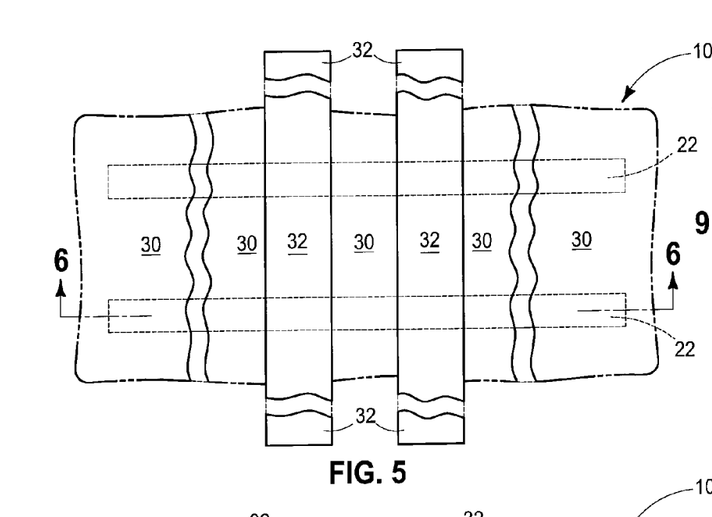
FIG. 5 is a view of the FIG. 3 substrate at a processing step subsequent to that shown by FIG. 3.
Figure 6:
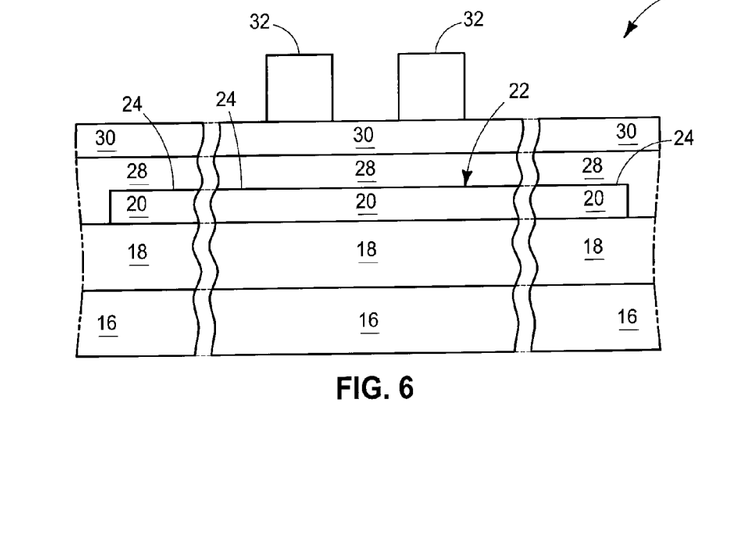
FIG. 6 is a cross-sectional view taken through line 6-6 in FIG. 5.

Referring to FIGS. 5 and 6, masking material 28 and masking material 30 have been formed over first lines 22. Masking material 28 may be of different composition from that of material 20. As an example where material 20 comprises a Si—O—N-comprising material, material 28 may comprise carbon. In one embodiment, material 28 may be formed by depositing and patterning a spin-on material, for example spin-on carbon. Material 28 may be formed to greater, lesser, or equal thickness as material 20 of first lines 22. Material 30 may comprise hard-masking material and/or one or more antireflective coatings and may be of the same composition as material 20. Lines 32 (e.g., photoresist) have been formed over and cross masking material 28/30. Such are shown as being parallel and straight linear and cross first lines 22 orthogonally, although non-parallel, non-linear, non-orthogonally crossing, and/or other orientations and shapes may be used.

Figure 7:
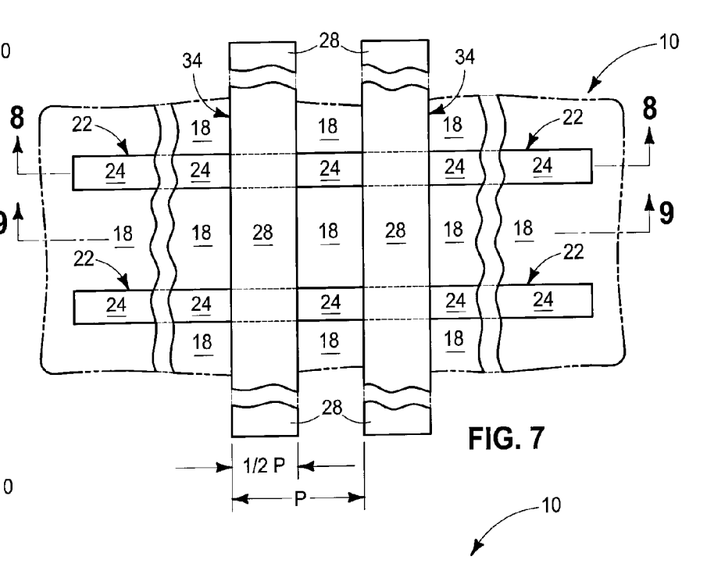
FIG. 7 is a view of the FIG. 5 substrate at a processing step subsequent to that shown by FIG. 5.
Figure 8:
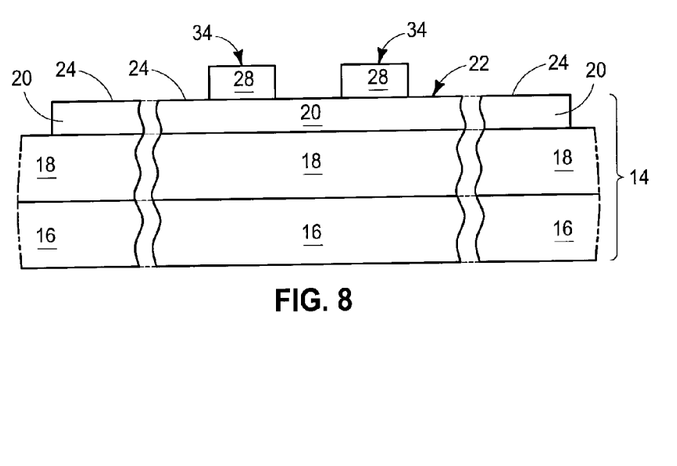
FIG. 8 is a cross-sectional view taken through line 8-8 in FIG. 7.
Figure 9:
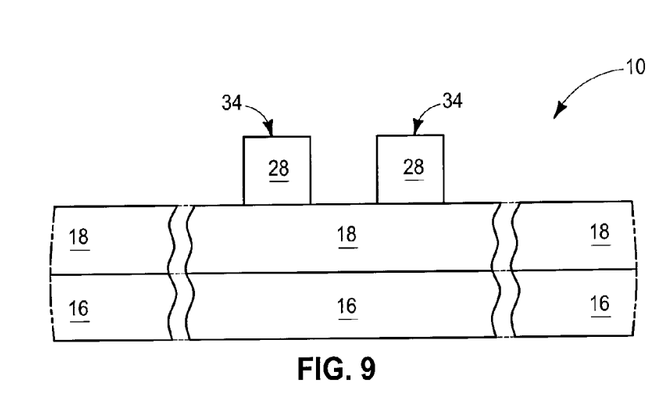
FIG. 9 is a cross-sectional view taken through line 9-9 in FIG. 7.

Referring to FIGS. 7-9, lines 32 (not shown) have been used as masking while etching into hard-masking material 30 (not shown) and subsequently into masking material 28 in forming lines 34 there-from. Lines 32 (not shown) and masking material 30 (not shown) have ultimately been removed. The etching to form lines 34 has ideally been conducted selectively relative to material 20 of first lines 22. In the context of this document, selectivity in an etch requires removal of one material at a rate relative to another material of at least 2:1.

Figure 10:
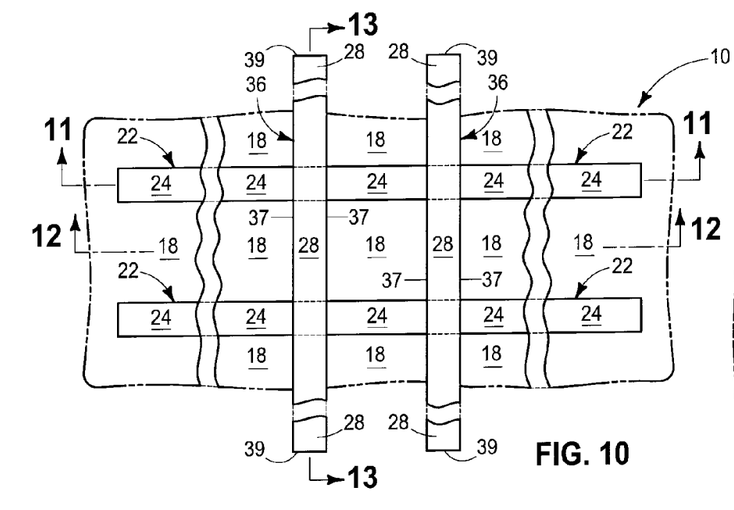
FIG. 10 is a view of the FIG. 7 substrate at a processing step subsequent to that shown by FIG. 7.
Figure 11:
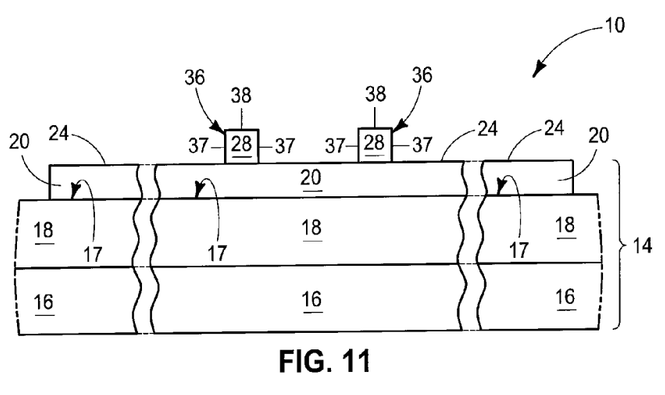
FIG. 11 is a cross-sectional view taken through line 11-11 in FIG. 10.
Figure 12:
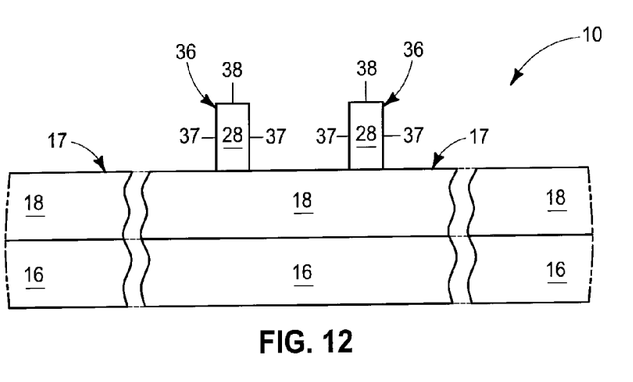
FIG. 12 is a cross-sectional view taken through line 12-12 in FIG. 10.
Figure 13:
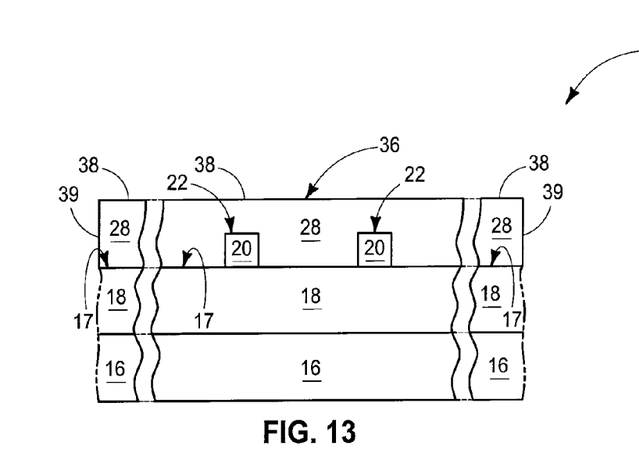
FIG. 13 is a cross-sectional view taken through line 13-13 in FIG. 10.

Referring to FIGS. 10-13, lines 34 (not shown) have been laterally trimmed in forming longitudinally elongated second lines 36 which are elevationally over and cross first lines 22. FIGS. 10-12 show the lateral trimming being effective to reduce the width of lines 32 in FIGS. 7-9 by half, although greater, lesser, or no lateral trimming may occur. Further where lateral trimming does occur, such may occur with respect to lines 32 of FIGS. 5 and 6 prior to or in addition to any lateral trimming of material 28 in lines 36. Alternate or additional techniques, whether existing or yet-to-be developed, may be used in forming second lines 36 elevationally over and crossing first lines 22. Second lines 36 may be considered as respectively comprising opposite sides 37, tops 38 (i.e, elevationally outermost surfaces), and ends 39. Such are shown as being planar, with sides 37 being parallel one another and tops 38 of different lines being co-planar. Other constructions may be used. Further, second lines 36 may be straight linear or non-linear (e.g. have multiple angled segments, curved segments, and/or be curvilinear, etc.), and may run parallel or non-parallel relative one another.

In one embodiment, second lines 36 are elevationally thicker between first lines 22 then atop of first lines 22, for example as is apparent in viewing FIGS. 11 and 12. Regardless, in one embodiment and as shown, underlying substrate 16/18 has a planar elevationally outermost surface 17 over which first lines 22 and second lines 36 are received, with each of the first and second lines extending to elevationally outermost surface 17.

Figure 14:
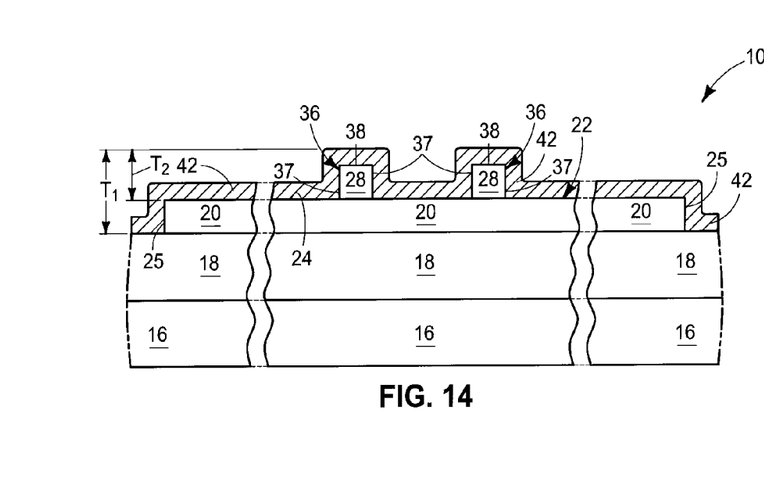
FIG. 14 is a view of the FIG. 11 substrate at a processing step subsequent to that shown by FIG. 11.
Figure 15:
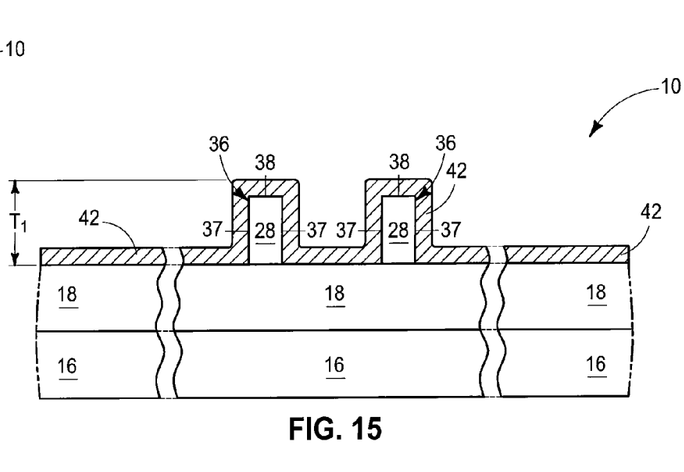
FIG. 15 is a view of the FIG. 12 substrate at a processing step subsequent to that shown by FIG. 12 and corresponding in processing sequence to that of FIGS. 14 and 16.
Figure 16:
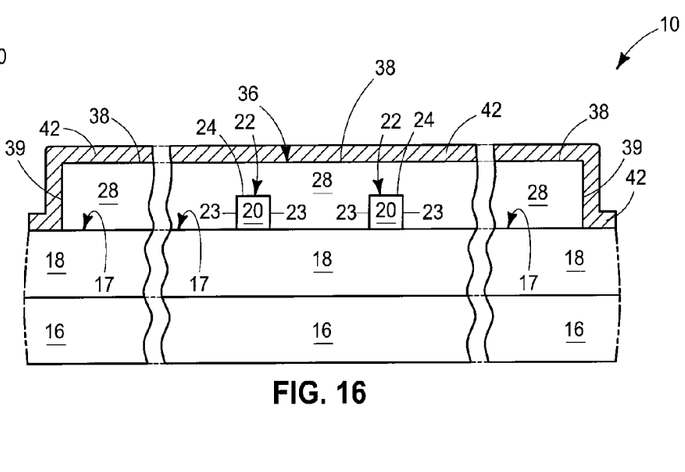
FIG. 16 is a view of the FIG. 13 substrate at a processing step subsequent to that shown by FIG. 13 and corresponding in processing sequence to that of FIGS. 14 and 15.
Figure 17:
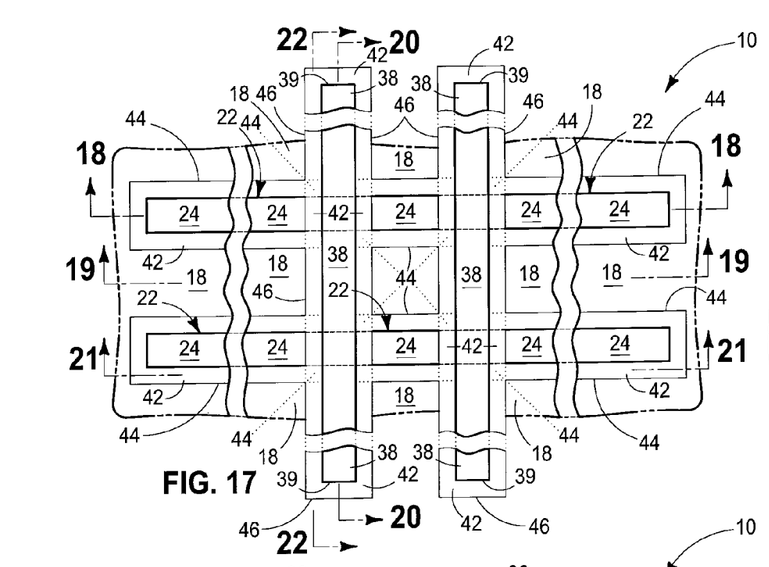
FIG. 17 is a view of the FIG. 10 substrate at a processing step subsequent to that shown by FIGS. 14, 15, and 16.
Figure 18:
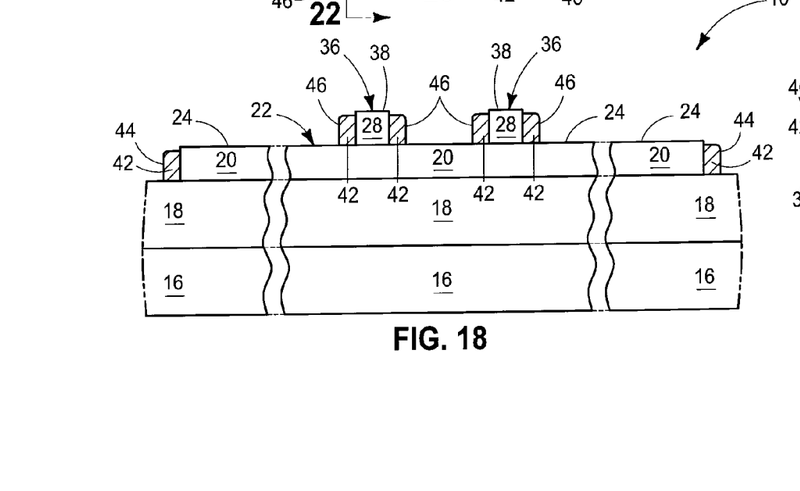
FIG. 18 is a cross-sectional view taken through line 18-18 in FIG. 17.
Figure 19:
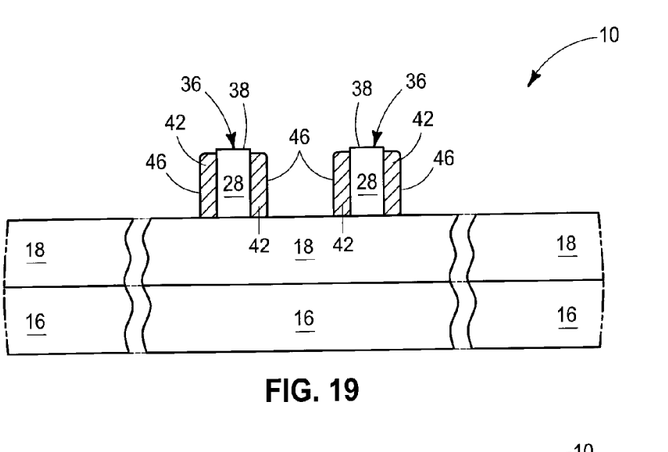
FIG. 19 is a cross-sectional view taken through line 19-19 in FIG. 17.
Figure 20:
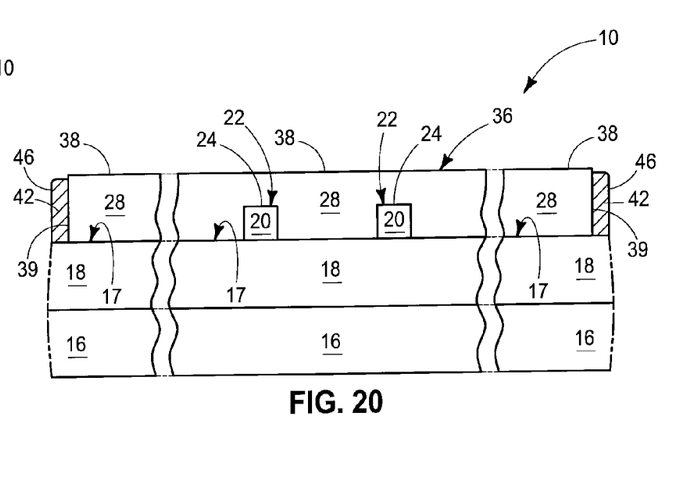
FIG. 20 is a cross-sectional view taken through line 20-20 in FIG. 17.
Figure 21:
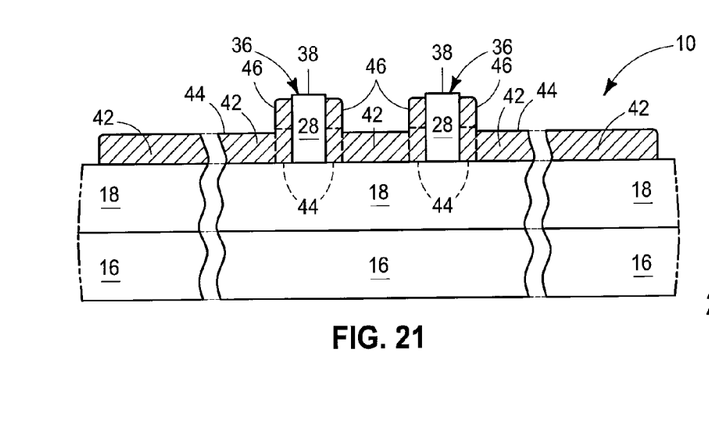
FIG. 21 is a cross-sectional view taken through line 21-21 in FIG. 17.
Figure 22:
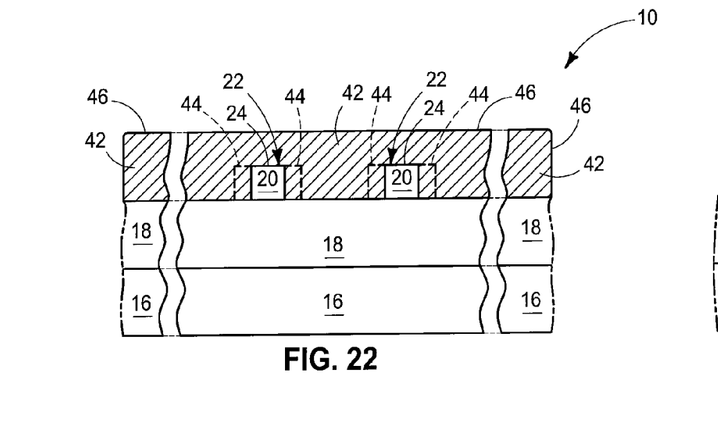
FIG. 22 is a cross-sectional view taken through line 22-22 in FIG. 17.

Referring to FIGS. 14-16, masking material 42 has been formed over tops 24, 38, and sides 23, 37 of the crossing first and second lines 22, 36, respectively. Masking material 42 may also be formed over ends 25 and 39 of the crossing first and second lines, as shown. In one embodiment, masking material 42 is formed to less-than-fill the void space that is between immediately adjacent second lines (i.e., a void space which is defined elevationally by a maximum height of second lines 36 and laterally by the space between immediately adjacent second lines 36). Masking material 42 will ideally be of a composition which enables first lines 22 and second lines 36 to ultimately be selectively etched relative to masking material 42. Masking material 42 is shown as being formed to a thickness which is less than an equal width of the first and second lines, although lesser or greater thickness may be used, including thickness that is substantially equal to width of the first and second lines. Masking material 42 may be formed to a thickness that is less than a minimum photolithographic feature dimension. Masking material 42 may be elevationally thicker between first lines 22 than elevationally over first lines 22, for example as shown with respect to thickness $T_1$ (FIGS. 14 and 15) and thickness $T_2$ (FIG. 14). Masking material 42 is ideally deposited in a very conformal and thickness-controlled manner (e.g., by chemical vapor deposition or atomic layer deposition) to achieve precise control of feature width.

Referring to FIGS. 17-22, masking material 42 has been removed to expose tops 24, 38 of first lines 22 and second lines 36, respectively, and in one embodiment to expose all of second line tops 38. In one embodiment, such may be considered as forming first sidewall spacers 44 longitudinally along opposite sides of first lines 22, and forming second sidewall spacers 46 longitudinally along opposite sides of second lines 36, wherein the second lines and second sidewall spacers cross elevationally over the first lines and first sidewall spacers. Masking material 42 is shown without cross-hatching in FIG. 17 for better clarity in showing first sidewall spacers 44 where such are beneath and crossed by second sidewall spacers 46 in such figure. In one embodiment, for example as shown and described, the first and second sidewall spacers may be formed at the same time. The act of removing may be, by way of example, by anisotropic etching, and which may be maskless (i.e., no mask being over the substrate during the act of removing). The first sidewall spacers and/or the second sidewall spacers may be formed as a respective ring around the individual first and/or second lines, for example as shown.

Figure 23:
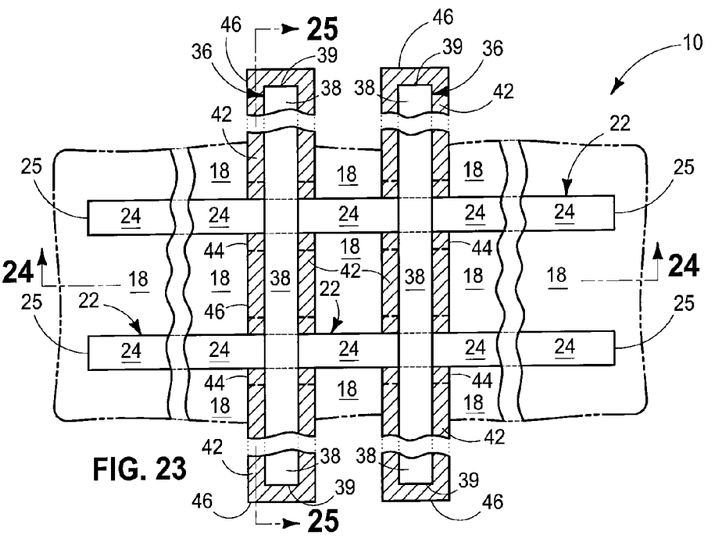
FIG. 23 is a view of the FIG. 17 substrate at a processing step subsequent to that shown by FIG. 17.
Figure 24:
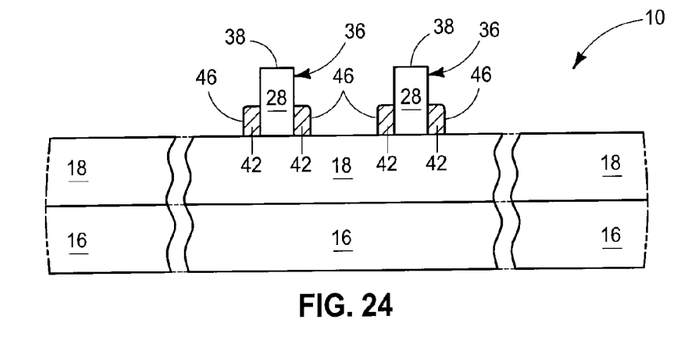
FIG. 24 is a cross-sectional view taken through line 24-24 in FIG. 23.
Figures 25, 26, 27, 28:
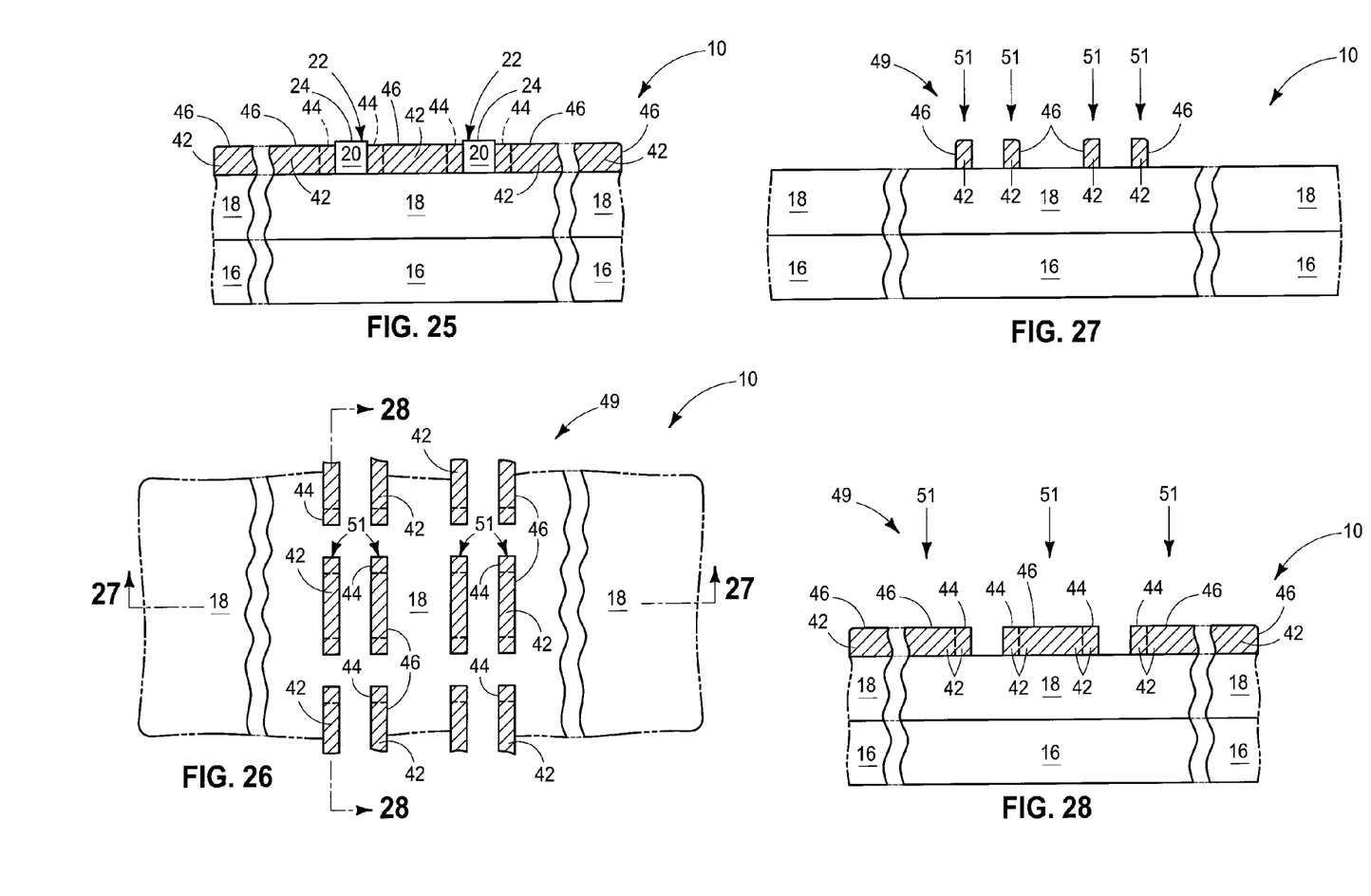
FIG. 25 is a cross-sectional view taken through line 25-25 in FIG. 23.
FIG. 26 is a view of the FIG. 23 substrate at a processing step subsequent to that shown by FIG. 23.
FIG. 27 is a cross-sectional view taken through line 27-27 in FIG. 26.
FIG. 28 is a cross-sectional view taken through line 28-28 in FIG. 26.

Referring to FIGS. 23-25, second sidewall spacers 46 have been removed from crossing over first lines 22. Cross-hatching of masking material 42 in the top view of FIG. 23 is shown consistent with that of FIGS. 24 and 25. In one embodiment and as shown, second sidewall spacers 36 extend completely between immediately adjacent first lines 22 after having been removed from crossing over first lines 22. Regardless, in one embodiment at least some of masking material 42 remains along sidewalls of second lines 36 between immediately adjacent first lines 22. In one embodiment, the act of removing may also remove masking material 42 from being received over all of ends 25 of first lines 22 (as shown), and in one embodiment from being received over all of ends 39 of second lines 36 (not shown). Regardless, the processing starting at the completion of forming the FIGS. 14-16 structure through and to producing a structure such as that shown in FIGS. 23-25 may occur in a continuous manner without stopping to produce an intermediate structure like that of FIGS. 17-22. For example where first sidewall spacers 44 and second sidewall spacers 46 are formed by anisotropic etching of a masking material, that anisotropic etching may be started with respect to the structure of FIGS. 14-16 and continued without stopping to proceed directly to that of FIGS. 23-25. Nevertheless, in one embodiment, the first and second sidewalls spacers are formed in such a continuous process even if only transiently.

Referring to FIGS. 26-28, first lines 22 (not shown) and second lines 36 (not shown) have been removed in forming a pattern 49 which comprises spaced regions 51 of masking material 42 over underlying substrate 16/18. In one embodiment, spaced regions 51 comprise portions of first sidewall spacers 44 and second sidewall spacers 46. In one embodiment, the spaced regions are generally rectangular in horizontal cross-section (i.e, viewed from top-down) having adjacent sides of unequal length. In one embodiment and as shown, the rectangular spaced regions 51 have longer sides that are more than three times length of the shorter sides. This results in part from masking material 42 being formed to have a thinner lateral thickness along sidewalls of second lines 46 than the width of second lines 46. In one embodiment, the rectangular spaced regions are provided to be about three times length of the shorter sides, for example as shown in FIGS. 37 and 38 with respect to an alternate embodiment substrate fragment 10a. Like numerals from the above described embodiments have been used where appropriate, with some construction differences being indicated with the suffix "a". FIGS. 37 and 38 correspond in structure to that of FIGS. 26 and 27, respectively, but wherein masking material 42 in a resultant pattern 49a has been formed to be thicker and equal to width of second lines 36 (not shown) than in the example shown in the FIGS. 14-28 embodiment, thereby forming laterally thicker first sidewall spacers 44a and second sidewall spacers 46a. Accordingly as shown, spaced rectangular regions 51a have longer sides that are about three times the length of the shorter sides. Longer sides less than three times the length of the shorter sides may be achieved by forming laterally thicker first sidewall spacers (not shown). Regardless, spaced regions 51/51a might be processed further, for example by being subject to lateral trimming.

Figure 29:
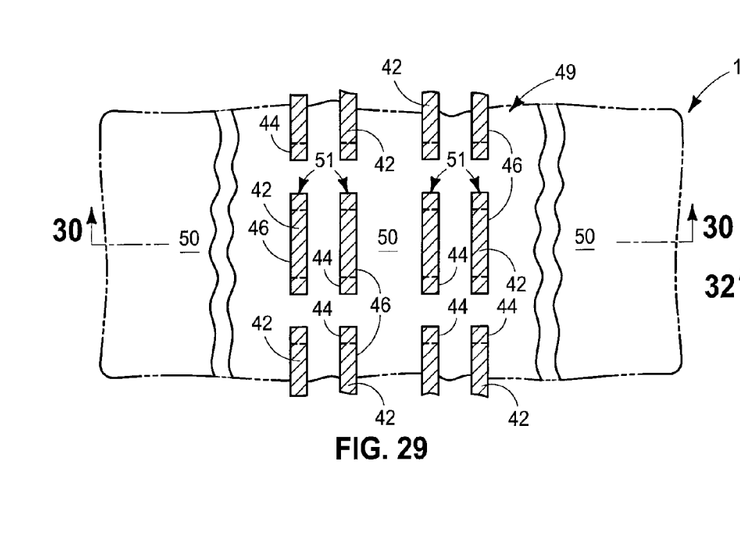
FIG. 29 is a view of the FIG. 26 substrate at a processing step subsequent to that shown by FIG. 26.
Figure 30:
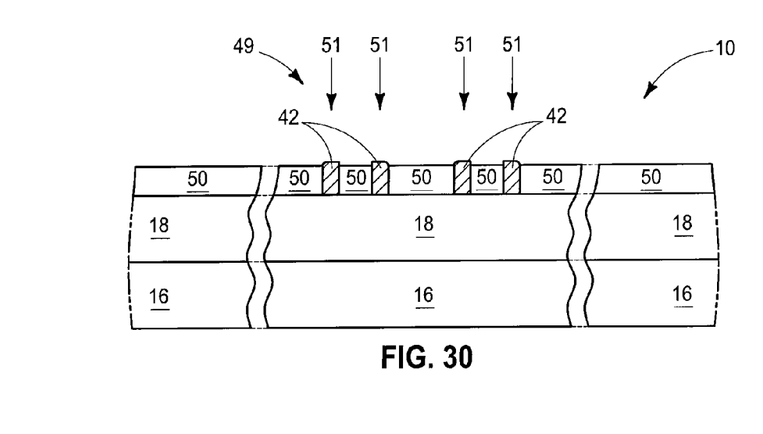
FIG. 30 is a cross-sectional view taken through line 30-30 in FIG. 29.

Pattern 49 may be transferred in whole or in part to underlying substrate 16/18, if desired, in a number of different manners. Further, second sidewall spacers 46 that were over the ends of second lines 36 (not shown in FIGS. 26-28) may be removed or used in patterning underlying substrate material. Further, if removed, such may occur prior to or commensurate with the processing of FIGS. 23-25. Regardless, FIGS. 29 and 30 show example of subsequent processing where the end portions of spacers 46 (not shown) have been removed, and a fill material 50 has been formed laterally of masking material regions 51.

Figure 31:
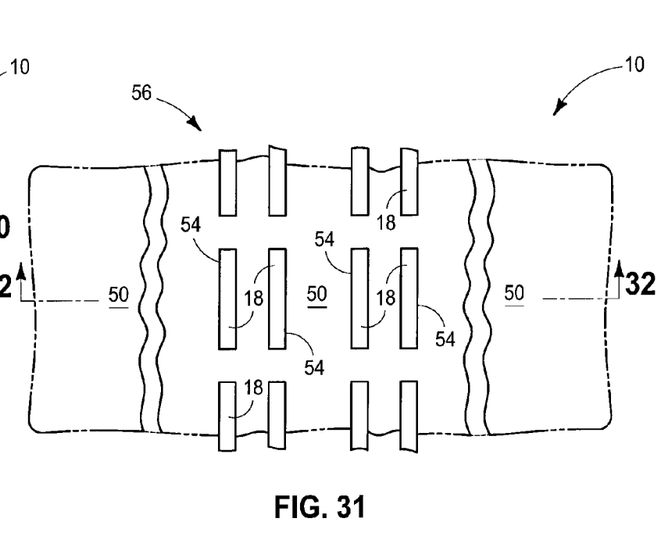
FIG. 31 is a view of the FIG. 29 substrate at a processing step subsequent to that shown by FIG. 29.
Figure 32:
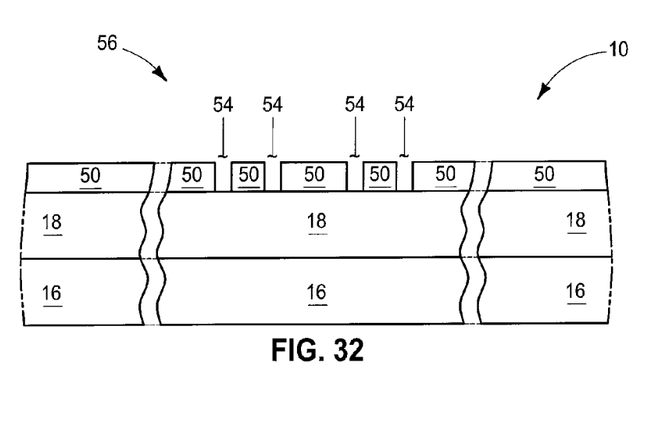
FIG. 32 is a cross-sectional view taken through line 32-32 in FIG. 31.

Referring to FIGS. 31 and 32, masking material regions 51 (not shown) have been removed in forming openings 54 in fill material 50. In one embodiment, such may form a contact opening mask 56 which comprises fill material 50.

Figure 33:
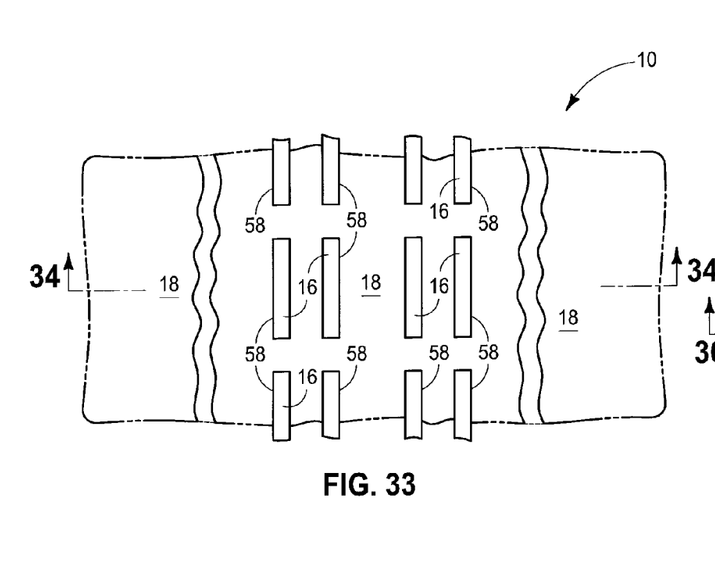
FIG. 33 is a view of the FIG. 31 substrate at a processing step subsequent to that shown by FIG. 31.
Figure 34:
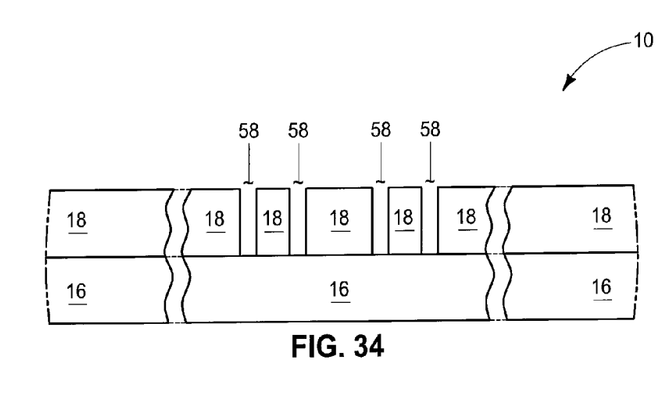
FIG. 34 is a cross-sectional view taken through line 34-34 in FIG. 33.

Referring to FIGS. 33 and 34, contact opening mask 56 (not shown) has been used while etching contact openings 58 into underlying substrate 16/18, and has been removed.

In one embodiment, the pattern which is formed has a minimum feature width that is half of the half-pitch. For example, lines 34 in FIGS. 7-9 may be considered as precursor second lines having a pitch P and a half thereof designated as ½P. Precursor second lines 34 may be laterally trimmed in forming second lines, for example as shown in FIGS. 10-13. Pattern 49a in FIGS. 37 and 38 has a minimum feature width that is half of the half-pitch ½P in FIG. 7 (i.e., ¼P).

Figure 35:
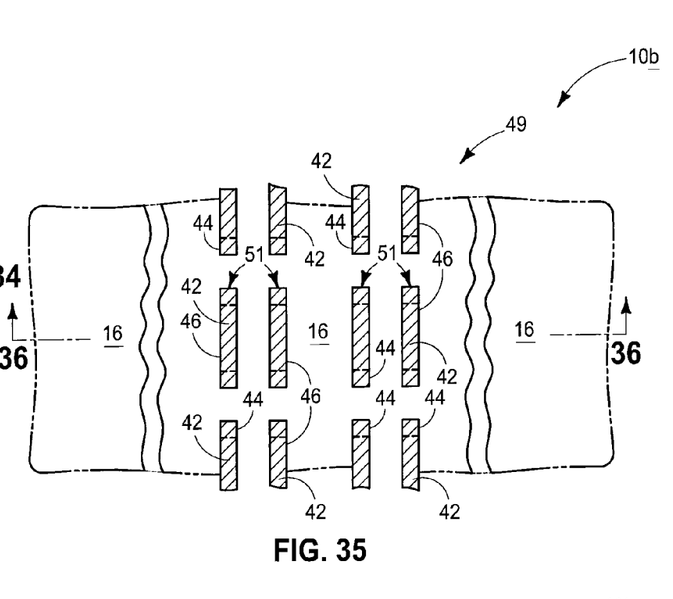
FIG. 35 is a view of a substrate showing alternate processing.
Figure 36:
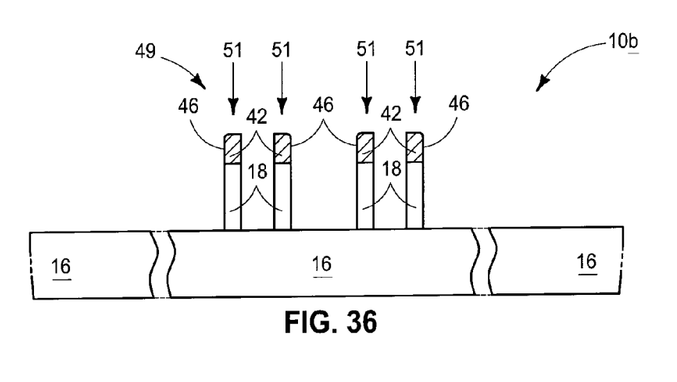
FIG. 36 is a cross-sectional view taken through line 36-36 in FIG. 35.

FIGS. 35 and 36 shows alternate example processing to that shown by FIGS. 29-34 with respect to a subsequently processed substrate 10b. Like numerals from the above-described embodiments have been used where appropriate, with some construction differences being indicated with the suffix "b". In FIGS. 35 and 36, underlying substrate 16/18 has been etched into using remaining of the first and second sidewall spacers 44, 46 (e.g., spaced masking material regions 51) as an etch mask.

CONCLUSION

In some embodiments, a method of forming a pattern on a substrate comprises forming longitudinally elongated first lines and first sidewall spacers longitudinally along opposite sides of the first lines elevationally over an underlying substrate. Longitudinally elongated second lines and second sidewall spacers are formed longitudinally along opposite sides of the second lines. The second lines and the second sidewall spacers cross elevationally over the first lines and the first sidewall spacers. The second sidewall spacers are removed from crossing over the first lines. The first and second lines are removed in forming a pattern comprising portions of the first and second sidewall spacers over the underlying substrate.

In some embodiments, a method of forming a pattern on a substrate comprises forming longitudinally elongated first lines elevationally over an underlying substrate. Longitudinally elongated second lines and masking material are formed longitudinally along opposite sides of the second lines. The second lines and the masking material cross elevationally over the first lines. The second lines and the masking material are elevationally thicker between the first lines than elevationally over the first lines. The masking material is removed from crossing over the first lines while leaving at least some of the masking material along sidewalls of the second lines between immediately adjacent first lines. The first and second lines are removed in forming a pattern comprising spaced regions of the masking material over the underlying substrate.

In some embodiments, a method of forming a pattern on a substrate sequentially comprises forming longitudinally elongated first lines elevationally over an underlying substrate. Longitudinally elongated second lines are formed elevationally over and cross the first lines. A masking material is formed over tops and sides of the crossing first and second lines to less than fill void space between immediately adjacent second lines. The masking material is removed to expose the tops of the first and second lines. The first and second lines are removed in forming a pattern comprising spaced regions of the masking material over the underlying substrate.

In some embodiments, a method of forming a pattern on a substrate sequentially comprises forming longitudinally elongated first lines elevationally over an underlying substrate. Longitudinally elongated second lines are formed elevationally over and cross the first lines. The second lines are elevationally thicker between the first lines than over tops of the first lines. Masking material is formed over tops, sides and ends of the crossing first and second lines to less than fill void space between immediately adjacent second lines. The masking material is removed from over all of the tops and all of the ends of the first and second lines while leaving at least some of the masking material along sidewalls of the second lines between immediately adjacent first lines. The first and second lines are removed in forming a pattern comprising spaced regions of the masking material over the underlying substrate.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method of forming a pattern on a substrate sequentially comprising:
    forming longitudinally elongated first lines elevationally over an underlying substrate;
    forming longitudinally elongated second lines elevationally over and crossing the first lines;
    forming a masking material in spaces between sides of the crossing first and second lines to less than fill void space between immediately adjacent second lines; and
    removing the first and second lines in forming a pattern comprising spaced regions of the masking material over the underlying substrate.

2. A method of forming a pattern on a substrate, comprising:
    forming longitudinally elongated first lines and first sidewall spacers longitudinally along opposite sides of the first lines elevationally over an underlying substrate;
    forming longitudinally elongated second lines and second sidewall spacers longitudinally along opposite sides of the second lines, the second lines and the second sidewall spacers crossing elevationally over the first lines and the first sidewall spacers, the first and second sidewall spacers being together formed during a single anisotropic etch of masking material;
    removing the second sidewall spacers from crossing over the first lines; and removing the first and second lines in forming a pattern comprising portions of the first and second sidewall spacers over the underlying substrate.

3. The method of claim 2 wherein the second sidewall spacers extend completely between immediately adjacent first lines after the removing of the second sidewall spacers from crossing over the first lines.

4. The method of claim 2 wherein the second lines are elevationally thicker between the first lines than atop the first lines.

5. A method of forming a pattern on a substrate, comprising:
forming longitudinally elongated first lines and first sidewall spacers longitudinally along opposite sides of the first lines elevationally over an underlying substrate;
forming longitudinally elongated second lines and second sidewall spacers longitudinally along opposite sides of the second lines, the second lines and the second sidewall spacers crossing elevationally over the first lines and the first sidewall spacers, the second sidewall spacers having elevationally outermost surfaces that are elevationally inward of elevationally outermost surfaces of the second lines;
removing the second sidewall spacers from crossing over the first lines; and
removing the first and second lines in forming a pattern comprising portions of the first and second sidewall spacers over the underlying substrate.

6. The method of claim 5 comprising forming the first sidewall spacers as a ring around the respective first lines.

7. The method of claim 5 comprising forming the second sidewall spacers as a ring around the respective second lines.

8. The method of claim 5 wherein the first and second sidewall spacers are together formed during a single anisotropic etch of masking material.

9. The method of claim 5 wherein forming the second sidewall spacers comprises depositing and subsequently anisotropically etching a masking material.

10. The method of claim 9 wherein the removing of the second sidewall spacers from crossing over the first lines comprises continuing the anisotropically etching of the masking material without stopping the etching between the forming of the second sidewall spacers and the removing of the second sidewall spacers from crossing over the first lines.

11. A method of forming a pattern on a substrate, comprising:
forming longitudinally elongated first lines and first sidewall spacers longitudinally along opposite sides of the first lines elevationally over an underlying substrate;
forming longitudinally elongated second lines and second sidewall spacers longitudinally along opposite sides of the second lines, the second lines and the second sidewall spacers crossing elevationally over the first lines and the first sidewall spacers, the first and second lines physically contacting one another where such cross;
removing the second sidewall spacers from crossing over the first lines; and
removing the first and second lines in forming a pattern comprising portions of the first and second sidewall spacers over the underlying substrate.

12. The method of claim 11 wherein the second sidewall spacers extend completely between immediately adjacent first lines after the removing of the second sidewall spacers from crossing over the first lines.

13. The method of claim 11 wherein the second lines are elevationally thicker between the first lines than atop the first lines.

14. A method of forming a pattern on a substrate, comprising:
forming longitudinally elongated first lines elevationally over an underlying substrate;
forming longitudinally elongated second lines and masking material longitudinally along opposite sides of the second lines and the first lines, the second lines and the masking material crossing elevationally over the first lines, the second lines and the masking material being elevationally thicker between the first lines than elevationally over the first lines;
removing the masking material from crossing over the first lines and from being along a majority of length of the first lines while leaving at least some of the masking material along sidewalls of the second lines between immediately adjacent first lines; and
removing the first and second lines in forming a pattern comprising spaced regions of the masking material over the underlying substrate.

15. The method of claim 14 comprising forming the first and second lines to have respective planar elevationally outermost surfaces.

16. A method of forming a pattern on a substrate, comprising:
forming longitudinally elongated first lines and first sidewall spacers longitudinally along opposite sides of the first lines elevationally over an underlying substrate;
forming longitudinally elongated second lines and second sidewall spacers longitudinally along opposite sides of the second lines, the second lines and the second sidewall spacers crossing elevationally over the first lines and the first sidewall spacers;
removing the second sidewall spacers from crossing over the first lines;
removing the first and second lines in forming a pattern comprising portions of the first and second sidewall spacers over the underlying substrate;
after removing the first and second lines, forming fill material laterally of the portions of the first and second sidewall spacers;
removing remaining of the portions of the first and second sidewall spacers in forming a mask comprising the fill material; and
using the mask while etching contact openings into the underlying substrate.

17. The method of claim 16 wherein the portions of the first and second spacers in the pattern are generally rectangular in horizontal cross-section having adjacent sides of unequal length.

18. The method of claim 17 wherein the rectangular portions have longer sides that are about three times length of the shorter sides.

19. The method of claim 17 wherein the rectangular portions have longer sides that are more than three times length of the shorter sides.

* * * * *